United States Patent
Acar et al.

(10) Patent No.: US 10,474,774 B2
(45) Date of Patent: Nov. 12, 2019

(54) POWER AND PERFORMANCE SORTING OF MICROPROCESSORS FROM FIRST INTERCONNECT LAYER TO WAFER FINAL TEST

(71) Applicant: International Business Machines Corporation, Armonk, NY (US)

(72) Inventors: Emrah Acar, Montvale, NJ (US);
Moyra K. McManus, Veldhoven (NL);
Sani R. Nassif, Austin, TX (US);
Matthew J. Sullivan, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 959 days.

(21) Appl. No.: 14/017,634

(22) Filed: Sep. 4, 2013

(65) Prior Publication Data

US 2015/0066467 A1   Mar. 5, 2015

(51) Int. Cl.
*G06F 17/50* (2006.01)

(52) U.S. Cl.
CPC ...... *G06F 17/5036* (2013.01); *G06F 17/5045* (2013.01)

(58) Field of Classification Search
None
See application file for complete search history.

(56) References Cited

U.S. PATENT DOCUMENTS

| | | | |
|---|---|---|---|
| 6,028,994 A * | 2/2000 | Peng | G01R 31/30 257/E21.525 |
| 6,222,145 B1 * | 4/2001 | Cook | B07C 5/34 209/573 |
| 6,549,863 B1 | 4/2003 | Morinaga | |
| 7,079,960 B2 | 7/2006 | Chen et al. | |
| 2008/0147355 A1 | 6/2008 | Fields et al. | |
| 2009/0039912 A1 * | 2/2009 | Bickford | G01R 31/2884 324/750.3 |
| 2009/0295402 A1 * | 12/2009 | Balch | G01R 31/2884 324/537 |

(Continued)

OTHER PUBLICATIONS

Rizzolo et al., System performance management for the S/390 Parallel Enterprise Server G5, Sep. 1999, IBM, vol. 43 No. 5/6, pp. 651-660.*

(Continued)

*Primary Examiner* — Omar F Fernandez Rivas
*Assistant Examiner* — Bernard E Cothran
(74) *Attorney, Agent, or Firm* — Scully, Scott, Murphy & Presser, P.C.; Daniel Morris, Esq.

(57) ABSTRACT

A system, method and computer program product for sorting Integrated Circuits (chips), particularly microprocessor chips, and particularly that predicts chip performance or power for sorting purposes. The system and method described herein uses a combination of performance-predicting parameters that are measured early in the process, and applies a unique method to project where the part, e.g., microprocessor IC, will eventually be sorted. Sorting includes classifying the IC product to a subset of a family of products with the product satisfying certain performance characteristics or specifications, in the early stages of manufacturing, e.g., before the end product is fully fabricated.

18 Claims, 13 Drawing Sheets

(56) References Cited

U.S. PATENT DOCUMENTS

| | | | |
|---|---|---|---|
| 2009/0306815 A1* | 12/2009 | McManus | G06F 11/24 700/223 |
| 2010/0005041 A1* | 1/2010 | Wang | G06N 99/005 706/12 |
| 2011/0082680 A1* | 4/2011 | Chang | G01R 31/2848 703/14 |
| 2011/0169499 A1 | 7/2011 | Bhushan et al. | |
| 2011/0276166 A1 | 11/2011 | Atanasoff | |

OTHER PUBLICATIONS

Salem et al., Structural and functional test of IBM System z10 chips, 2009, IBM, vol. 53 No. 1, pp. 5:1-5:11.*
Zhang et al., A Machine Learning Approach to Modeling Power and Performance of Chip Multiprocessors, 2011, IEEE, pp. 45-50.*
Roy et al., Test Consideration for Nanometer-Scale CMOS Circuits, 2006, IEEE, pp. 128-136 (Year: 2006).*
Jeong et al., Accurate Machine-Learning-Based On-Chip Router Modeling, 2010, IEEE, pp. 62-66 (Year: 2010).*
Chan et al., "Design Dependent Process Monitoring for Back-end Manufacturing Cost Reduction", 2010.
Lee et al., "IC Performance Prediction for Test Cost Reduction", 1999.
Bhushan et al., "Ring Oscillators for CMOS Process Tuning and Variability Control", IEEE Transactions on Semiconductor Manufacturing, vol. 19, No. 1, Feb. 2006.
"Accurate and Efficient Frequency Evaluation of a Ring Oscillator", Agilent Technologies, 2011.

* cited by examiner

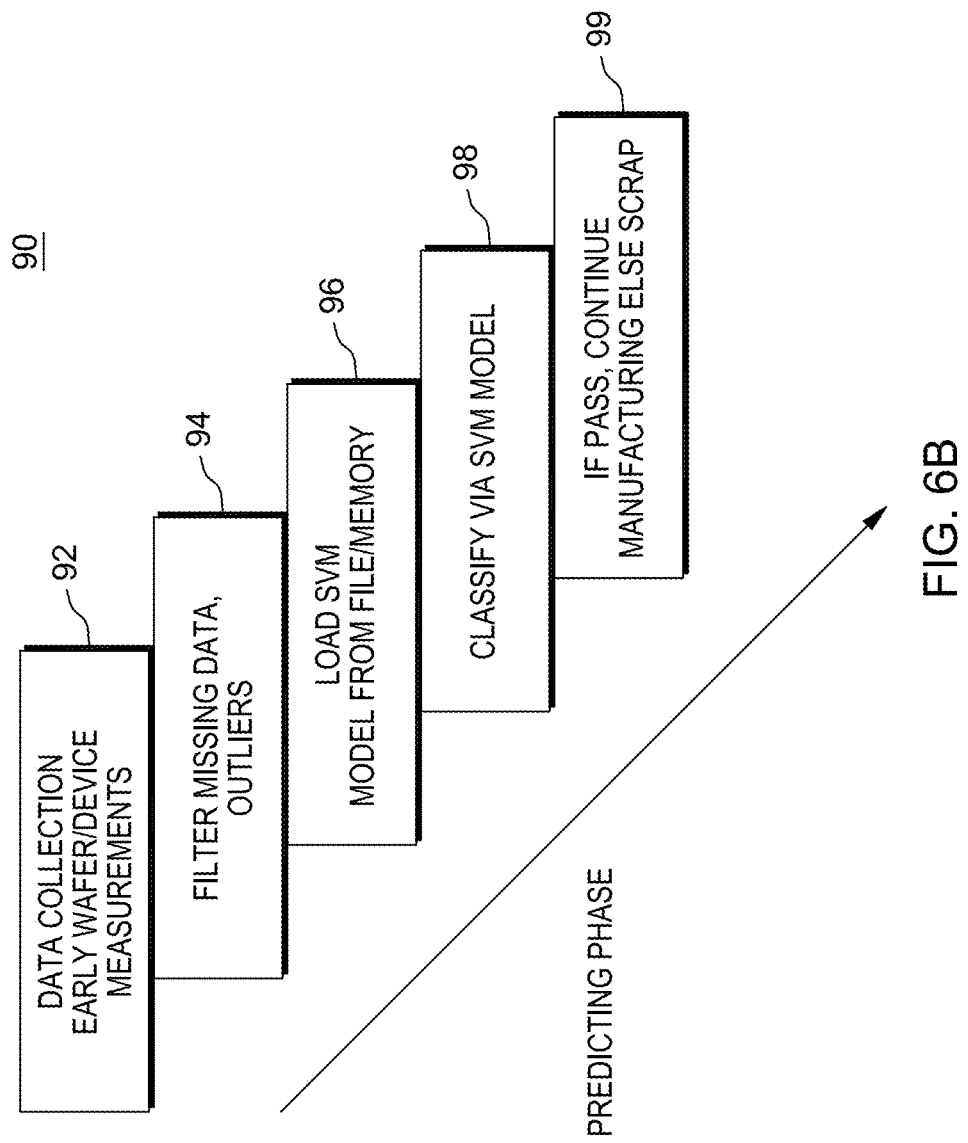

| CLASSIFICATION THRESHOLD | % OF DATA THAT PASSES | USING 90% FOR TRAINING | USING 70% FOR TRAINING | USING 50% FOR TRAINING |
|---|---|---|---|---|
| 40 | 36.7% | 92.46% | 92.31% | 92.08% |
| 60 | 15.88% | 94.71% | 94.61% | 94.71% |
| 80 | 7.24% | 95.66% | 95.41% | 94.99% |
| 100 | 2.54% | 97.46% | 97.46% | 97.46% |
| 120 | 0.43% | 99.57% | 99.57% | 99.57% |

FIG. 10

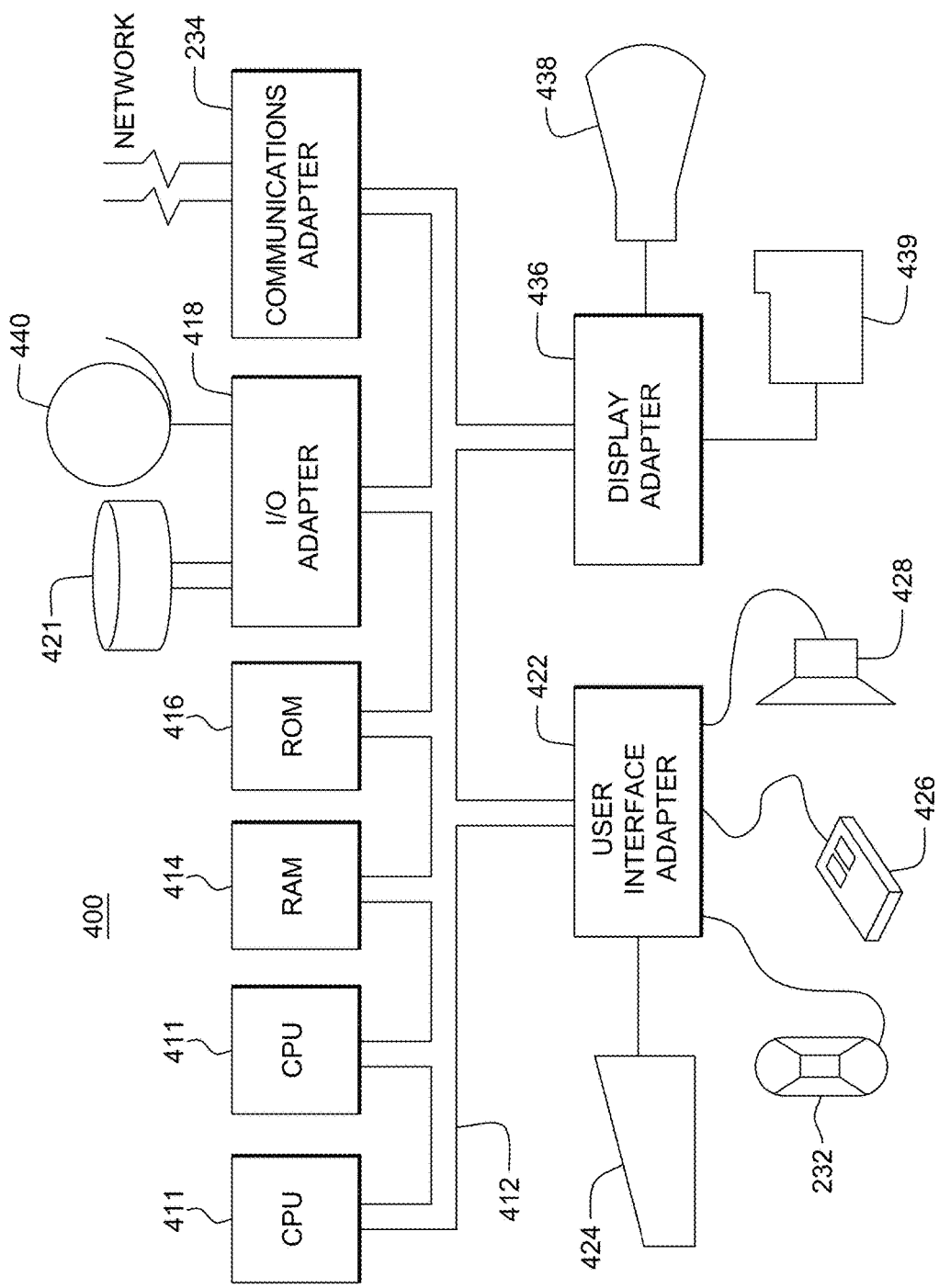

POWER AND PERFORMANCE SORTING OF MICROPROCESSORS FROM FIRST INTERCONNECT LAYER TO WAFER FINAL TEST

FIELD OF THE INVENTION

This disclosure relates generally to sorting methodologies employed to sort microprocessors according to a performance criteria, and particularly to an improved decision sorting process that predicts chip performance or power for sorting purposes and the corresponding sorting.

BACKGROUND

Microprocessor chips (e.g., integrated circuits or ICs) are manufactured to function at some published and guaranteed frequency and power. The frequency and power are usually measured after a final manufacturing step, i.e., the final metal level has been processed, at which point the completed configuration of the chips can either be divided up into different speed and power bins or discarded if found not to meet the requirements. The semiconductor industry currently uses several different speed-predicting metrics for speed sorting or screening.

It would be highly desirable to predict chip performance or power and the corresponding sorting (classification to a subset of a family of products by satisfying certain performance characteristics or specifications) in the early stages of manufacturing, i.e., before the end product is fully fabricated and tested for quality assurance.

More specifically, the microprocessor chips are being made within silicon wafers for which many chips are being processed at the same time. Normally the manufacturing process takes quite some time since it has to undergo many steps involving costly and complex machinery and labor.

It would be highly advantageous to screen out any defective chips (or wafers in general) as well as to project their corresponding performance as early as possible in the flow in order to make any necessary adjustments to the process in order to meet the demand.

While current prior art techniques often project final performance values to within 50-70% of final values while a new manufacturing process is ramping up, it would be advantageous to be able to project final wafer test values with much improved accuracy at this same stage in the development cycle.

SUMMARY

There are described a system, a method and a computer program product for sorting chips, particularly microprocessor chips or ICs, that predicts chip performance or power for sorting purposes.

More particularly, the system, method and a computer program product performs the corresponding sorting by classifying the product to a subset of a family of products with the product satisfying certain performance characteristics or specifications, in the early stages of manufacturing, e.g., before the end product is fully fabricated.

The system, method and a computer program product allows for optimizing the supply chain in order to meet a wide variety of performance criteria by adapting the process in a more predictable manner than was possible with prior art. The system and method described herein uses a combination of performance-predicting parameters that are measured early in the process, and applies a unique method to project where the part, e.g., microprocessor IC, will eventually be sorted.

In one aspect, there is provided a method of predicting a performance classification of integrated circuits ICs. The method comprises: receiving at a programmed computing system manufacturing level performance-predictive parameter data obtained during an early manufacturing phase of the chip, and corresponding chip performance metrics data of the resulting manufactured chips; specifying one or more sorting criterion for IC performance sorting; building from the obtained performance-predictive parameter data, the chip performance metrics data and the sorting criterion, a model for performance binning of new ICs; and subsequently predicting, using the built model, a performance classification of new integrated circuits from new early performance-predictive parameter data obtained from a new IC is being manufactured, wherein a processor unit coupled to a memory device performs: the receiving, criterion specifying and model building and the predicting.

Further, there is provided a system for predicting a performance classification of integrated circuits ICs. The system comprises: a memory storage device; a processor unit coupled to the memory storage device and configured to: receive manufacturing level performance-predictive parameter data obtained during an early manufacturing phase of the chip, and corresponding chip performance metrics data of the resulting manufactured chips; specify one or more sorting criterion for IC performance sorting; build from the obtained performance-predictive parameter data, the chip performance metrics data and the sorting criterion, a model for performance binning of new ICs; and subsequently predict, using the built model, a performance classification of new integrated circuits from new early performance-predictive parameter data obtained from a new IC is being manufactured.

A computer program product is provided for performing operations. The computer program product includes a storage medium readable by a processing circuit and storing instructions run by the processing circuit for running methods. The storage medium readable by a processing circuit is not a propagating signal. The methods are the same as listed above.

BRIEF DESCRIPTION OF THE DRAWINGS

The objects, features and advantages of the present invention will become apparent to one skilled in the art, in view of the following detailed description taken in combination with the attached drawings, in which:

FIG. 6B illustrates programmed method steps for a predicting phase implementation 90 in the system 20' of FIG. 5B in one embodiment;

FIG. 10 shows an example data results 300 of implementing the method used in prediction accuracy of chip accuracy power represented as the % of chips passing on the basis of different programmed IDDQ thresholds for different example training data set sizes; and FIG. 11 illustrates examples of a computing system that can run the methods illustrated in FIGS. 6A, 6B in one embodiment;

DETAILED DESCRIPTION

Figure 1:
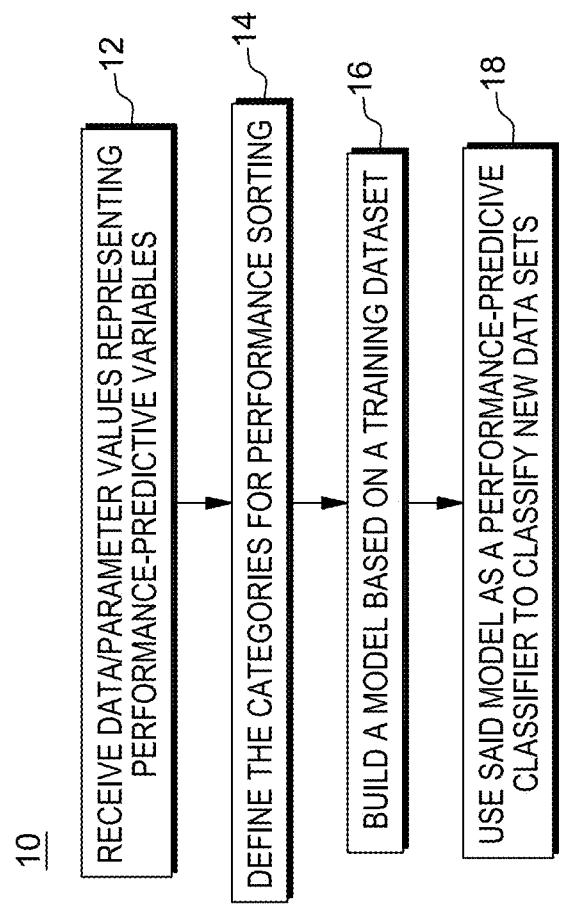
FIG. 1 illustrates a flowchart that describes a general method for predicting performance of integrated circuits and corresponding sorting of manufactured ICs in one embodiment.

There are described a classification method, a system and a computer program product for projecting final performance variables associated with manufactured electronic devices, e.g., such as microprocessors or other integrated circuitry (IC's). While described specifically for high-performance microprocessors, the techniques described herein may be applied with other types of chips, e.g., application specific integrated circuits.

In one embodiment, the classification based method described uses in-line parametric measurements at an early semiconductor development stage, i.e., during production of the first level of metallization, to project final performance variables in order to determine the eventual frequency and power of a microprocessor and the product disposition to a specific part number.

In one embodiment, such measured performance variables include the period of a ring oscillator test structure, i.e., a performance scaling ring oscillator (PSRO), the quiescent current (IDDQ), the on and off currents of a typical representative device, the beta ratio between the nFET and pFET, etc. Data from parts that have been tested at both the first level of interconnect and subsequently at final wafer test is used to construct a performance classification model.

In one aspect, the system and method described herein is used in the prediction of IDDQ (performance) sorting. It may be also employed as a learning vehicle for determining new classes of "classification" methods which work better than traditional regression based methods. For example, such new class of "classification" methods described herein to predict whether IDDQ>$I_{THR}$, whether a sortv (e.g., threshold voltage)>threshold, etc., perform better (i.e., have a far higher accuracy) than the more commonly used techniques of regression based models, and is able to provide projections of final wafer test values with 70-90% accuracy at an early stage in the development cycle.

Conceptually, normally a manufactured Integrated Circuit (IC) or chip will be produced such that the chip runs at a specified speed and the chip needs to burn power (energy) according to specifications. More power consumption may not be allowed due to constraint on power delivery system, and reliability. If there is too much power consumed on a chip, power supply will drop, and the circuits within the chip may fail due to incorrect power supply voltage. Hence there is needed to make sure that the chip (the circuits implemented) work at a specified frequency (speed) and at a power performance window. To allow that, device characteristics are measured that will be the building blocks of the circuits to predict what the chip will end up having. The device characteristics can be measured on-line, or on a wafer using measurements by physically probing the wafer in manufacturing process. There are quite a large number of parameters of a device that is a factor on its operation and performance. Thus, in one embodiment, the parameters important to speed and power are Ion (on-current), Ioff (off-state current, which is also known as leakage), Vt (threshold voltage, which transistor behaves quite different passing on this critical level), parasitic capacitances (pin capacitances on the device) etc. These are critical parameters tuned for a high-yield manufacturing process and indicate early performance predicting parameters.

FIG. 1 shows a flow chart conceptually depicting method 10 for power and performance sorting of chips (e.g., integrated circuits). As shown in FIG. 1 at 12, the system, embodied as a computing system such as shown in FIG. 11, receives data data/parameter values representing performance-predictive variables. For example, such values may include M1 (first metallization level) predictor parameters obtained early in the manufacturing process such as shown herein with respect to FIG. 2. Then, at 14, there is represented a processing step to define categories for performance sorting based on certain thresholds or combined functions of performance-predictive variables. Performance categories are also referred to herein as performance sorted "bins," such as a category for parts with low-power and low-speed, medium-power, high-speed, etc. In the process, a performance sorting criteria is established that describes the various performance bins in such a way as to place all the parts coming off the manufacturing line. One way of defining the bins uses thresholds on a key performance metric to partition the performance parameter space. As will be described, in a training dataset, there is provided a complete set of predictive variables and final results necessary to produce a predictive classifier model.

In one embodiment, for the processing step to define bins, the system and method may use certain thresholds or combined functions of performance variables to define the categories for performance sorting. For example, in one embodiment, the method is configured to predict whether the off-state current of the chip (i.e., "IDDQ" current) will be above a certain threshold value to classify chips as belonging in high or low leakage power categories. Similarly, performance sorting may be based on other performance variables such as the active (on) current of specific devices. To have the right balance of performance variables and perform efficient trade-offs, combinations of these performance variables may be used.

Step 16, FIG. 1, represents the system building a model(s) based on a training dataset that contains the early measurements of the performance-predictive variables and their associated final performance figures as well as their performance category information. The build model is then used as a performance-predictive classifier to classify new data sets at 18.

Figure 5B:
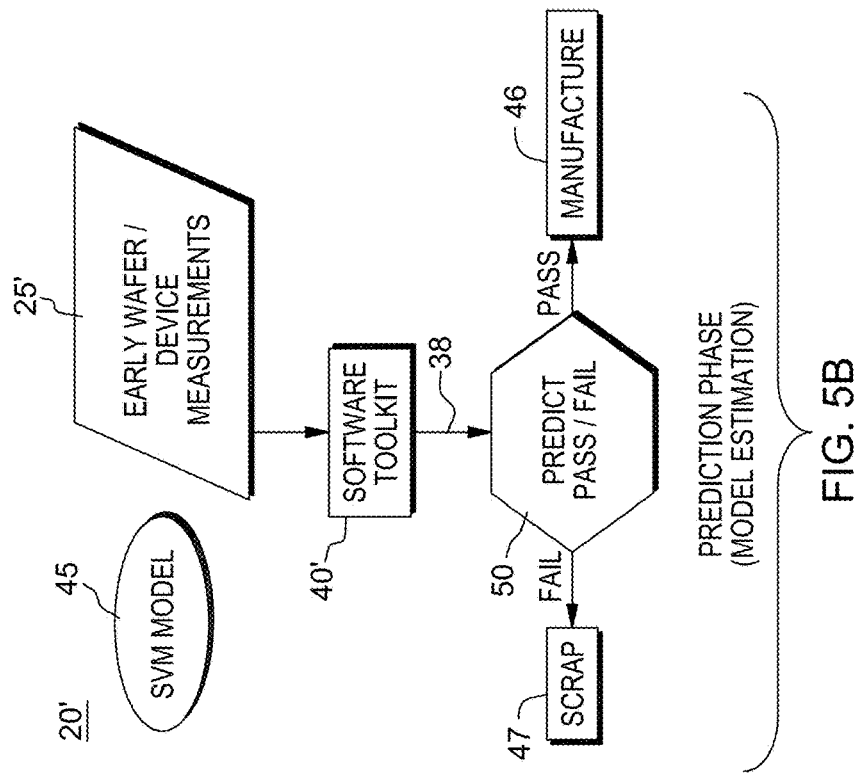
FIG. 5B shows a system 20' using the software model 45 in a performance classification predicting stage in one embodiment.
Figure 5A:
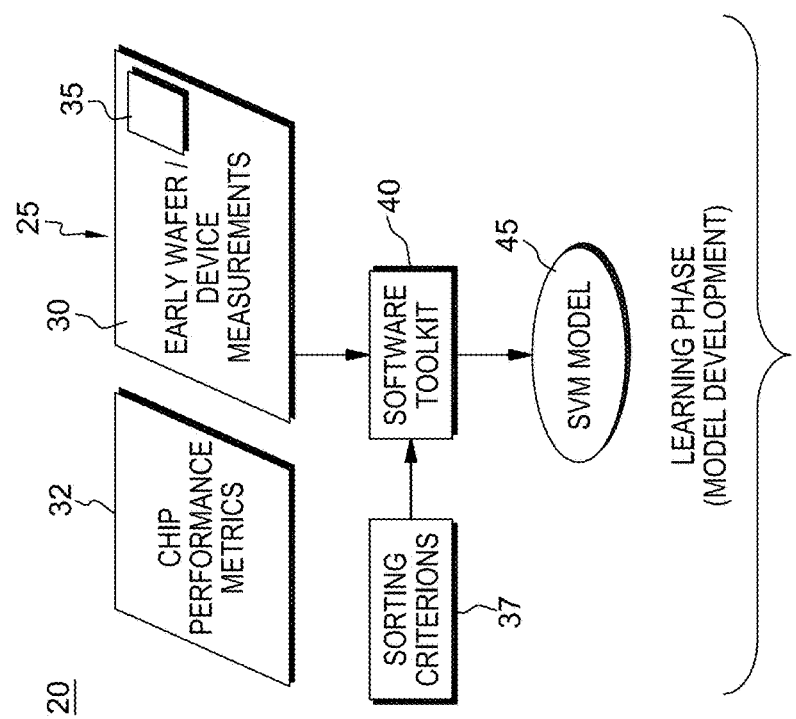
FIG. 5A shows a system 20 for building a software model 45 that will predict whether the semi-finished chip will yield to a good or bad part in one embodiment.

FIG. 5A shows a system 20 for building a software model 45 that will predict whether the semi-finished chip will yield to a good part that is shippable, or a bad part which may be scrapped, for example. The building of the model can be verified using cross-validation. FIG. 5A shows the system 20 implemented as a model development stage and FIG. 5B showing the system 20' used as a predicting stage.

The system 20 captures or otherwise receives as input from a memory storage device variable data 25 on early wafer device measurements. In this embodiment, a computer system having a programmed processor device as described herein with respect to FIG. 11, implements a classification method using pre-defined performance criterions to specify the categories to which the end-product is associated at the end of the manufacturing process. The system uses the early measurements of performance-predicting parameters that are available long before the final performance variables. For example, the in-line parametric measurements at the first level of metallization are typically available at least a month before the eventual final power and performance measurements.

Figure 2:
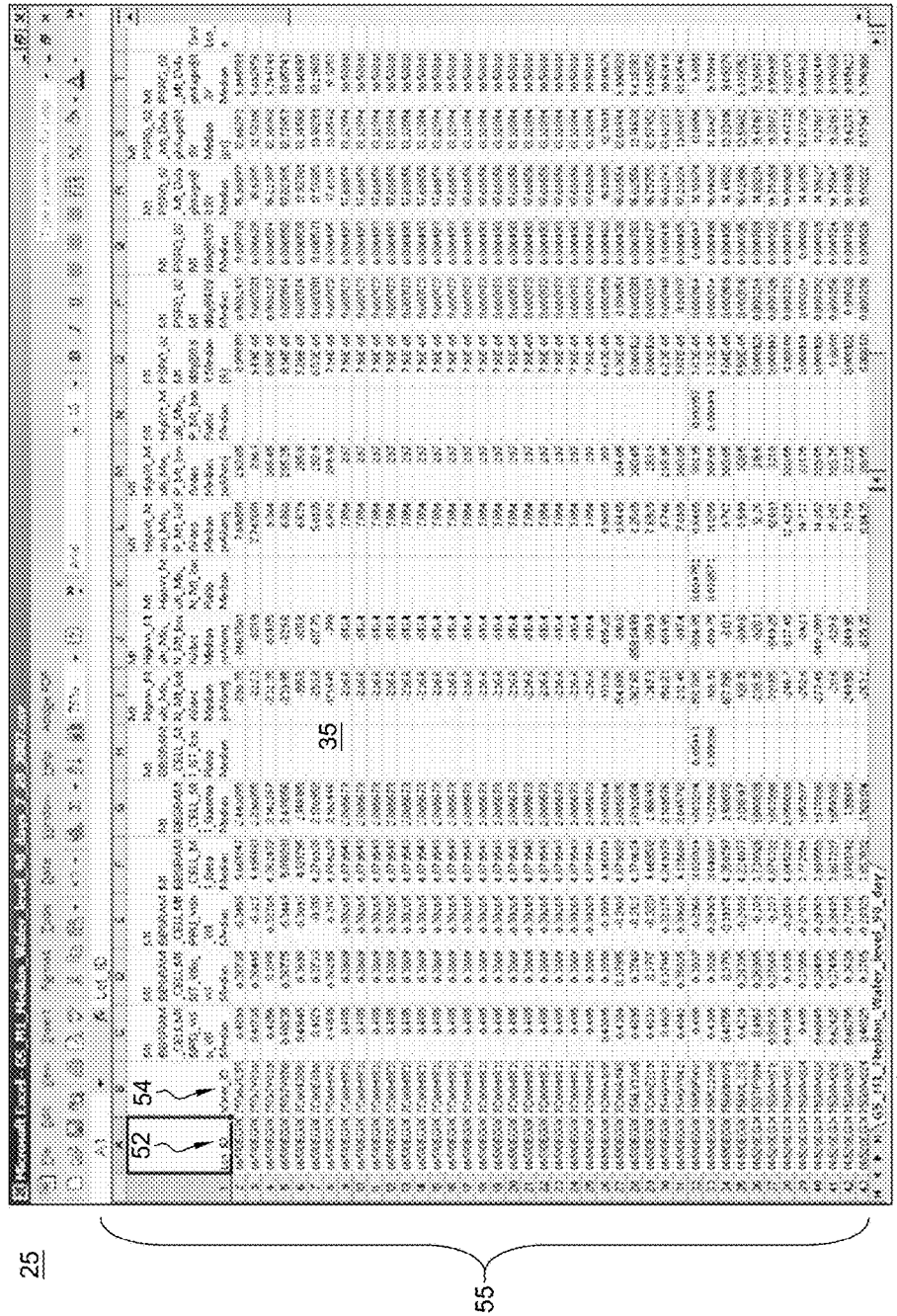
FIG. 2 illustrates an example plot or spreadsheet of a plot of example M1 level performance predictor data points for a particular wafer made available to the prediction system in one embodiment.

FIG. 2 shows an example plot or spreadsheet 25 of the example data 55 made available as input to the prediction system model development and predicting stages. In FIG. 2, there is depicted an example plot 25 of M1 level data points obtained and stored for particular manufactured wafers, indicated by a lot ID 52 and wafer ID 54 as rows 55 and obtained/stored values 35 as columns 57 in the plot 25 for the different M1 parameters. The word "parameters" in this sense is alternatively referred to herein as "variables". The first metallization (M1) level parameters (performance predictors) include, but are not limited to: VTlin, Ion, Ioff, PSRO_Iddq's, PSRO_Delay/stage. Other actual wafer parameters obtained as M1 performance predictors include, but are not limited to: m1_bb_psro, m1_iddq, m1_nfet_cj, m1_nfet_cov, m1_nfet_ieff, m1_nfet_ioff, m1_nfet_ion, m1_nfet_lpoly, m1_nfet_tox, m1_nfet_vtsat, m1_pd_ion, m1_pfet_cj, m1_pfet_cov, m1_pfet_ieff, m1_pfet_ioff, m1_pfet_ion, m1_pfet_lpoly, m1_pfet_tox, m1_pg_ion and m1_pu_ion. These are certain key device model parameters commonly known as compact device model parameters. These are key characterization values measured and used in the analysis of integrated circuits. Typical device model parameters like Vt (Threshold Voltage), ion (on state drain-source current), ioff (off state drain-source current), cj (device gate capacitance value), ieff (effective drain-source current), tox (thickness of gate oxide), vtsat (threshold for FET saturation operation), lpoly (length of gate diffusion polysilicon), coy (overlap capacitance of drain/source regions). These parameters are typically follow industrial standards for device model parameters.

Returning to FIG. 5A, in one embodiment, a subset 30 of the data may be used for data model training in system 20. This training data set 30 includes the early measurements of performance-predicting parameters that are available long before the final performance variables, e.g., the above mentioned in-line parametric measurements at the first level of metallization or M1 predictor variables. This data may be collected in the data sheet file formats (such as shown in FIG. 2), and provided to a computing system implementing a programming model platform (software tool kit) 40. Other input data include the chip performance measurements data 32 that are used in sorting the chips (identifying whether they meet certain specifications to be able to shipped to customer).

An implementation is now described for non-limiting purposes of illustration. The data input to the system, e.g., a computer system having a programmed processor device as described herein with respect to FIG. 11, includes the wafer median data for first metallization level (M1) parameters and for final IDDQ for known semiconductor chips. In the non-limiting example presented, the data input to the system includes manufacturing data pertaining to any semiconductor device, e.g., a microprocessor product.

Additionally provided are sorting criterions 37 that define whether a chip, e.g., microprocessor product, can be shipped (i.e., classified a good part). Sorting criterion is referred to herein as: Sortv, sorti, etc. For the data pertaining to an example chip, where, in one embodiment, sortv and sorti are functions used in defining chip constraints corresponding to power and leakage (chip level variables) for defining good and bad chips. For example, the method implements a sorting bin function based on computed sortv, sorti criterion: Sorting bin=fn (sortv, sorti . . . ).

For example, a possible sort criterion may be shown in the following TCL (Tool Command Language)-pseudocode: If the sortv is less than 1.30 V and sorti is less than 260 amp, this chip is being marked as shippable (1), else, it is not shippable (−1).

```
proc classify_sortv_sorti { sortv sorti } {
    if {$sortv<= 1.30 (voltage)} {
        if {$sorti<260 (amps)} {
            return 1
        }
    }
    return −1
}
``` where, in operation, the sortv voltage constraint of 1.3 is the maximal voltage to run and power the chip; and further sorti leakage constraint of a value 260 is a maximum current discharging constraint; In this embodiment, only when these performance function criterion are met will the chip be classified as good (a return value of 1); this exemplifies an absolute-type threshold, e.g., a flat value, where values are in one quadrant.

While a chip manufactured will be categorized based on its sortv, sorti metrics, the method uses other measurements as predictors, i.e., classifications models (predictors) that use the parameter measurements of m1_* to predict what the sorti/sortv can happen where m1_* indicates that the wafer is semi-finished, and measurements are obtained after m1 (first metal) has been deposited.

Figure 7:
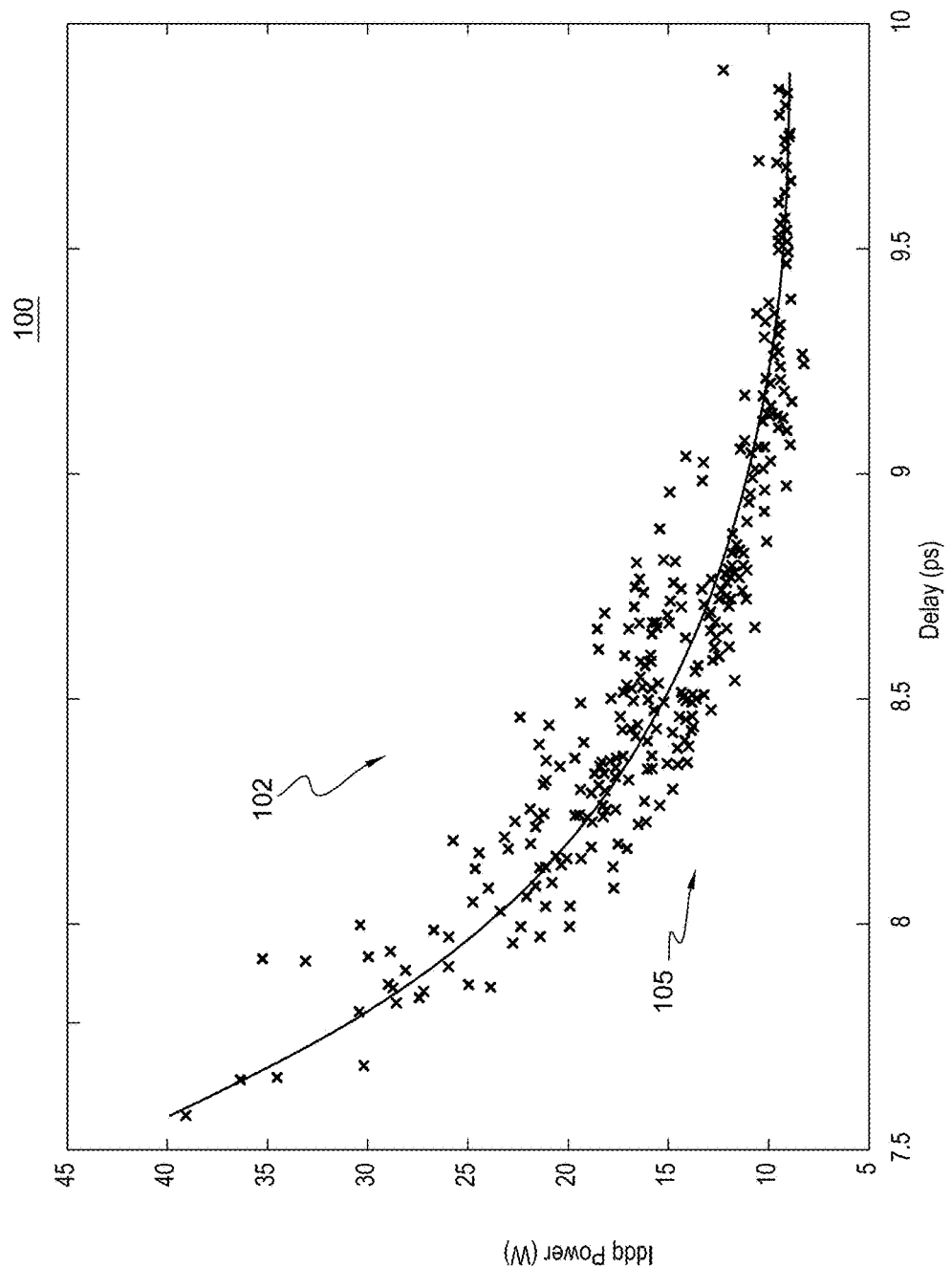
FIG. 7 illustrates a plot 100 of an example non-linear projection of accepted/rejected parts (samples) for determining a complex power sort criterion in an example embodiment.

It is understood that other thresholds for sortv and sorti sort criterion functions may be used. For example, the thresholds for sortv and sorti may be variable and interdependent. An example classifier may be based on a non-linear function where thresholding in a non-linear region may be defined. For example, FIG. 7 shows a plot 100 of an example non-linear projection of accepted/rejected parts (samples) where IDDQ leakage power in watts (e.g., sort v) samples are plotted on the y-axis versus PSRO delay in ps against the x-axis (sort i) according to a complex power criterion according to a non-linear, e.g., exponential function (e.g., governed according to Power=$\exp(a+b_1*d+b_2*d^2)$ where a, $b_1$, $b_2$, d are example coefficients). In the plot, there is included a region 102 of high-power samples to be rejected, and a non-linear region 105 of acceptable samples according to a complex region (there is not a single criterion for sortv or sort i making the chip sort decision more complex.

Thus, for the non-linear power performance criteria, a possible (more complex) sort criterion may be shown in the following pseudocode.

```
proc classify_exotic { sortv sorti } {
    set a [expr exp($sortv−1.30)*log($sorti/260)]
    if {$a>0} {return 1} else {return −1}
}
```

Further, the method includes dynamically changing the sortv and sorti thresholds for handling complex performance criteria. The sortv and sorti thresholds may further be used independently. This would support various kinds of operational sorting strategies designed to maximize profitability and define product performance specifications.

The system further implements methods for choosing a particular sorti or sortv criteria which criterions, in one embodiment, as may be set by the design/manufacturing leader. The system and method further supports various complexity in utilizing the criterions ranging simple to more complex ones. The above mentioned classify (and exotic) classify sortv sorti functions sorting criterions are implemented as functional blocks that define the criterions of a good part (return +1), as opposed to a fail part (return −1).

Returning to FIG. 5A, in building the methodology, the training data set is input to machine learning platform 40 that can use the entire data available, or a subset of it, to build a classification model as outlined above. The process of learning from a training set using an adaptive learning algorithm is the premise of many well-known machine learning techniques in general that can be used. In one aspect, this remainder test set data 35 may be used as a test set for validating the model classifier 45. The programming model platform 40 implements machine learning and produces the SVM classifier model 45 that will be used in a subsequent predicting stage, shown in FIG. 5B where only Early wafer device measurements 25' are available for the platform 40' to predict at 50 whether the chip (that is yet to be manufactured) will be in a good condition 46, e.g., meeting a criteria acceptable to a customer. If the prediction is a fail decision 47, the part can be scrapped or be sold as at a low-price, e.g., as in a "low performance" category in a sorting or binning process.

Hence the method described herein gives a prediction of the final performance of the end products one month prior to manufacturing completion The projection could be used in planning, modification and optimization of the design and manufacturing steps, or adjusting the performance criterion to accommodate changing business and technical objectives. It could also provide a prediction model for process optimization and tuning in the fab.

Figure 4A:
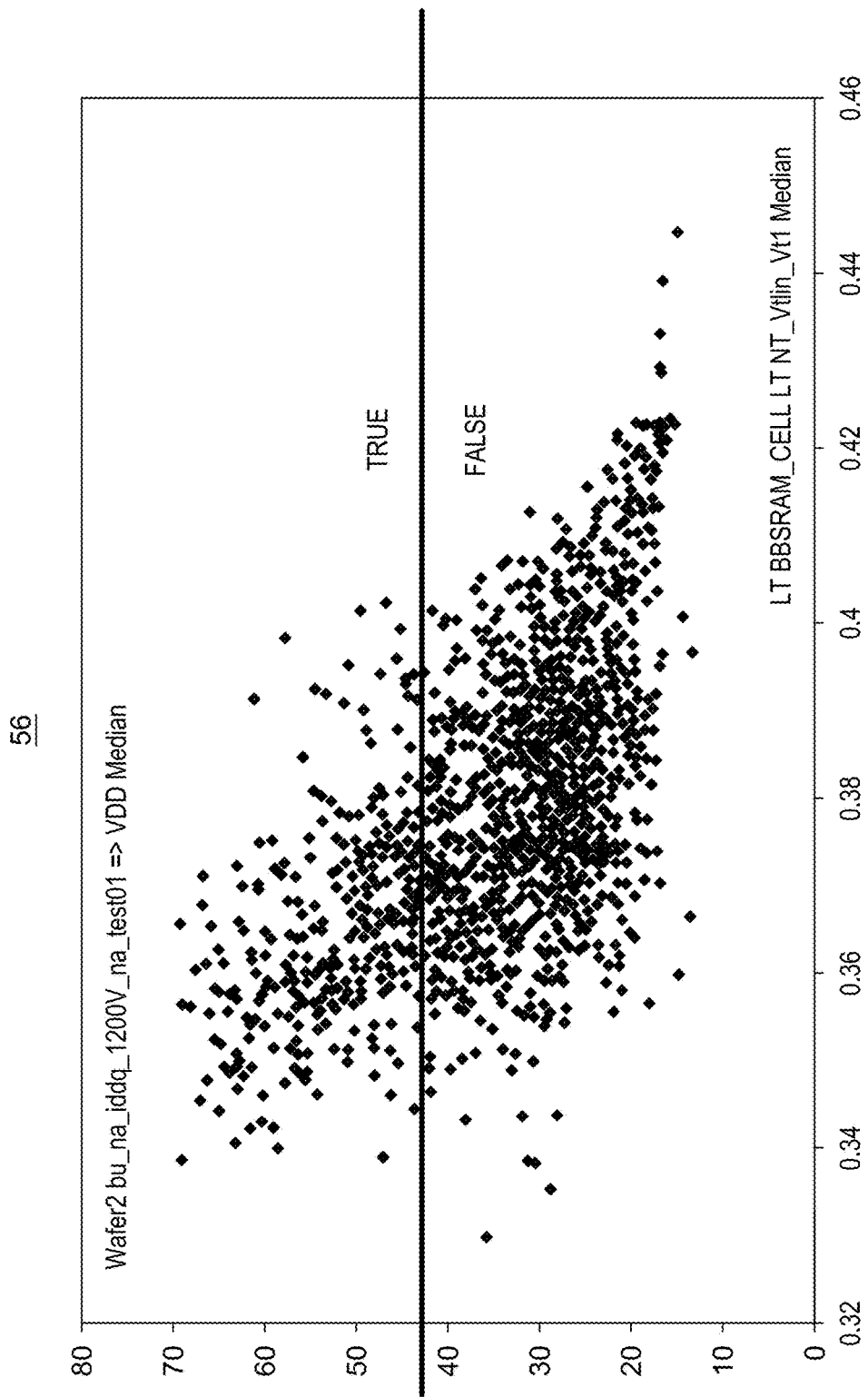
FIG. 4A shows an example 2-D plot of IDDQ vs. a variable (e.g., threshold voltage Vtlin) obtained from training data of chips performance predictor variables.

Referring next to FIG. 4A, in one embodiment, the method for model build employed at computing platform 40 includes generating respective two-dimensional (2-D) plots of IDDQ vs. each variable from which proposed sort bin classifications of this data may be determined. In FIG. 4A, there is shown one example 2-D plot 56 of IDDQ vs. a threshold voltage Vtlin training data of chips. As shown by the example data represented in the data plot 56 herein, no clear pattern emerges resulting in that no one variable controls the categories classified as true or false (e.g., whether to bin a chip as high performance or not).

Figure 3:
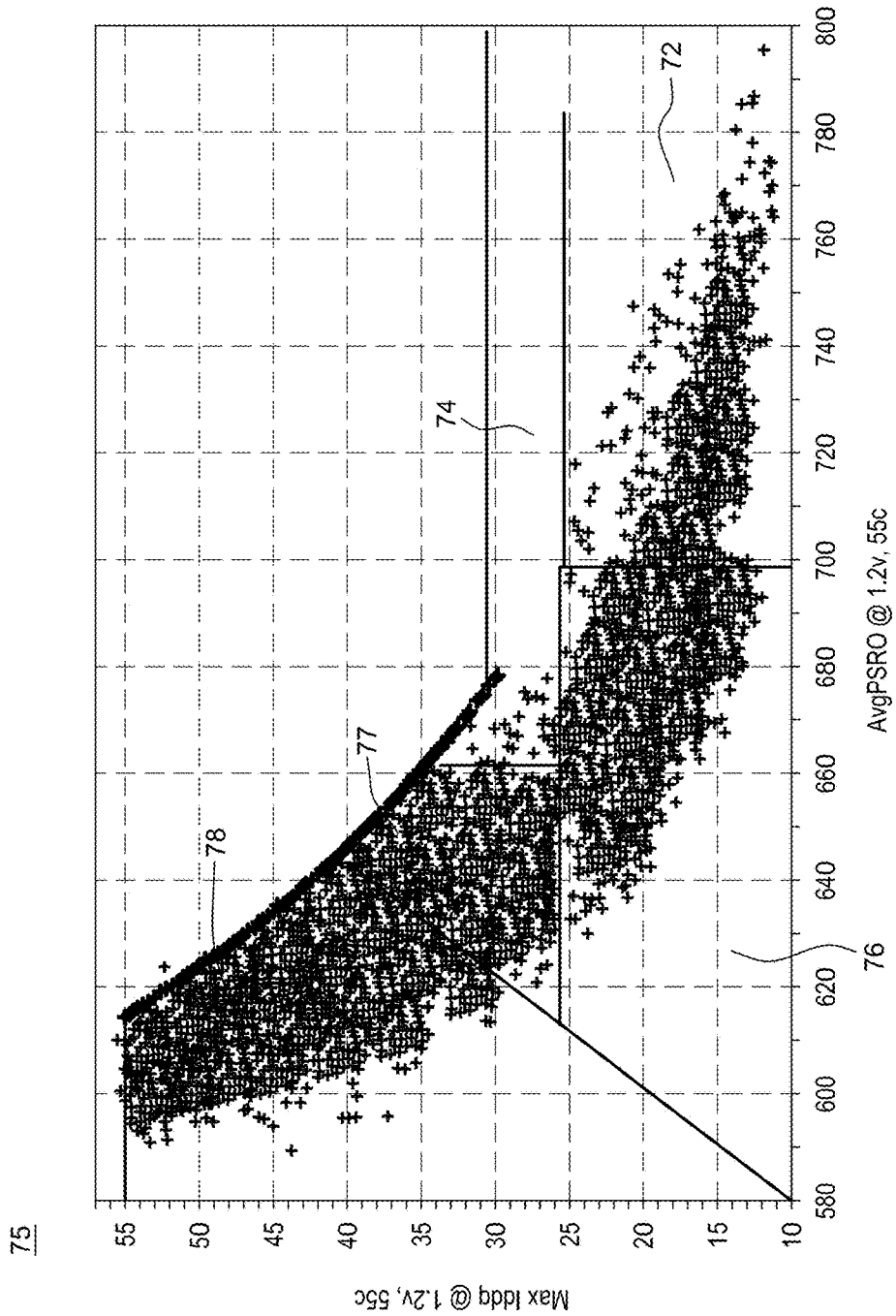
FIG. 3 illustrates example input parameter data corresponding to a sample of chips in a scatter diagram 75 that is used to generate performance sorting criterion (used for sort bins)

For non-limiting purposes of illustration, reference is had to the plot 75 of FIG. 3, where for a particular manufactured chip product, there is shown input parameter data corresponding to a sample of chips whose avg. PSRO delay (speed performance indicator) indicated on the x-axis and a maximum IDDQ in amps (the off-state current as a power indicator) indicated on the y-axis are shown in a scatter diagram. The overlaid regions indicate the performance bins used in branding these chips as different products. For example the chips marked in a region 78, are running fast since they have marginally low avg. PSRO delay and "reasonable" leakage current: two variables meeting these specifications will classify a part in this region. In a similar fashion, chips lying in the regions 72, 74 and 76 and 77 chips meet varying criteria for speed and power. The classification performed is based on a parametric formula using, in one embodiment, an avg. PSRO delay and IDDQ: bins are described mathematically as representing parts with PSRO above or below a certain value, and the same goes for the Iddq restrictions. Although, the classification algorithm utilize may be highly general, it could be parametric, or non-parametric. In one embodiment, a technique known as a Support Vector Machines (SVM) learning algorithm may be implemented.

As SVM technique works in higher dimensions, it may transform the predictive variables into a higher-dimensional space to maximize the separation between the performance categories and construct a hyper-plane model to maximally separate the performance categories. In imperfect separations, it could penalize mis-predictions in the transformed domain.

Figure 4B:
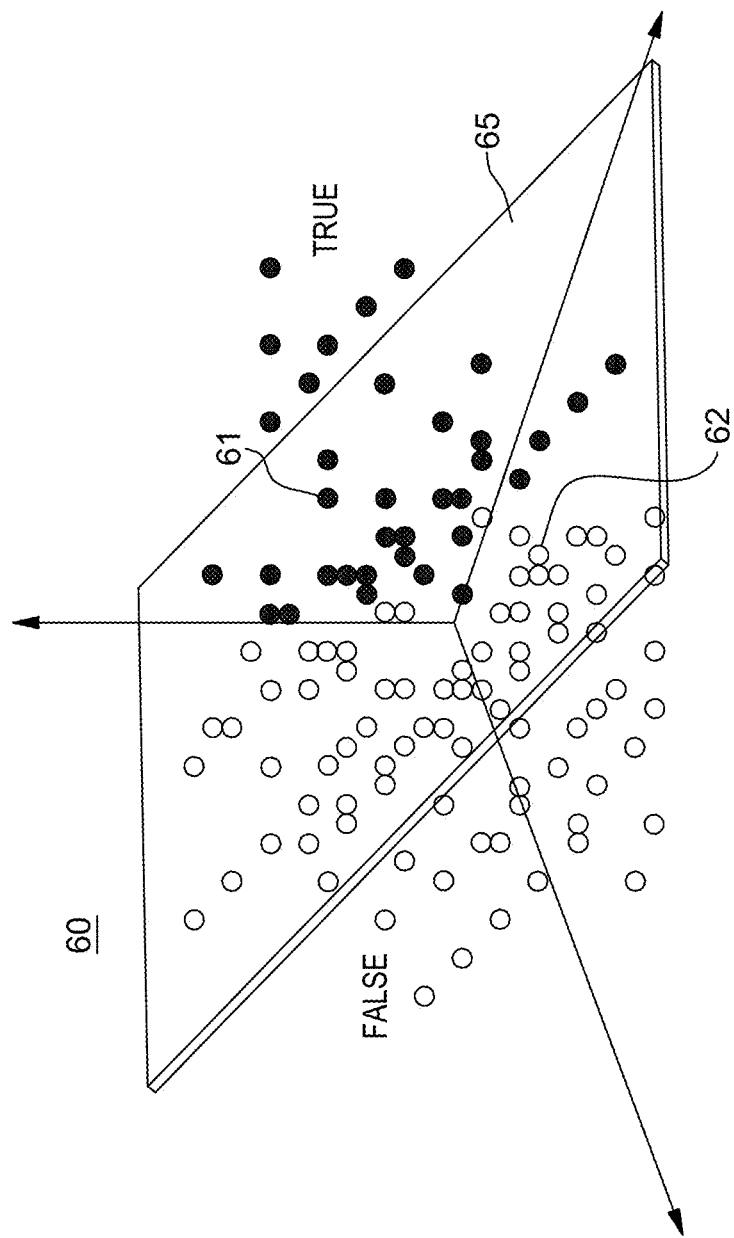
FIG. 4B generally illustrates a 2-D plot of example data values 60 whose sort classification (e.g., true v. false) is to be evaluated.

For example, the example plot 60 depicted in FIG. 4B shows samples of three predictive variables that result in a final product with categories classified as true or false, such as true category 61 or false category 62 respectively. An SVM algorithm is implemented by programmed computing system processes to find a two-dimensional hyper-plane 65 in terms of the three predictive variables that would maximally separate the two categories.

If the separation in the existing dimension is not very perfect (100% successful), the programmed algorithm may further implement nonlinear transformations that may separate the categories in a more efficient way. That would also be done using a nonlinear separation plane using the kernel function that defines a similarity metric between the samples. Once the classifier model 45 is obtained, it can be further used to predict any new sample whose predictive variables are provided.

Given the data used for building the model (training data) and the new samples (test data) come from similar conditions and processes, the models 45 would perform consistently. The model would be used in projecting a test set to predict what category a part will finally fall into with respect to its final performance variables.

In one aspect, the plane 65 referenced in FIG. 4B is created from the "training" set data 30, and can then be used to classify new data sets. That is, using data analytics and machine learning methods applied via machine learning tool 40, there is generated a classifier model 45 shown in FIG. 5A used to classify, e.g., bin, any further received data, such as test data 35. Outputs 38 generated by the classifier constitute a specific category to which the end-product, e.g., IC, microprocessor, is associated at the end of the manufacturing process.

As referred to in FIG. 5B, a prediction phase process 20' requires the SVM model 45 built in the learning phase and the datasets of early wafer device measurements. These results will be used in the learning tool/platform 40 to return a prediction of the yet-to-be finished chip, particularly, a product dispositioning to a specific part number. Based on the prediction decision, the manufacturing can continue at 46, or the part is scrapped at 47.

In the embodiment, learning tool 40 is a (support vector machine) SVM-based classification tool and is implemented as a software toolkit in the computing system of FIG. 11. The classifier module 45 of FIGS. 5A and 5B is configurable, but not limited to: perform generic data manipulation to define performance sorting bins (e.g., customized to data/project); create SVM-based model for performance sort; perform SVM-based sorting prediction on the new data; build regression models for any variable used in the sorting criterion; and perform regression based modeling and subsequent sorting.

In one embodiment, the software toolkit is in a Tool Command Language (e.g., TCL/TK version 8.6/8.5, 2013) programming language having SVM-Model capabilities (SVM-train and SVM-predict) separate; uses regression model building for comparison with state-of-art and model reporting; and configurable to perform linear, polynomial modeling, nonlinear transformation and step-wise modeling.

Figure 6A:
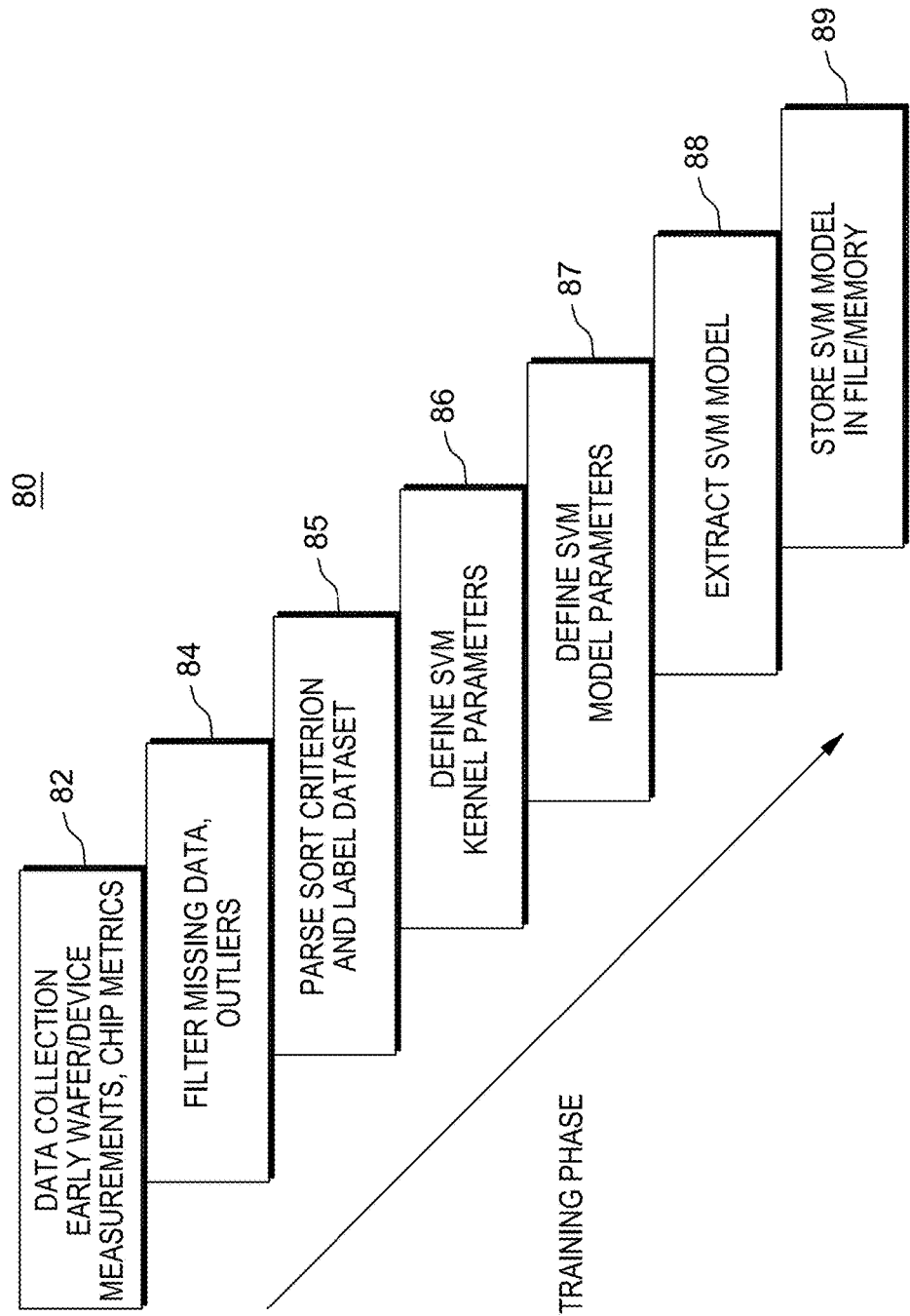
FIG. 6A illustrates programmed method steps for a training phase implementation 80 in the system 20 of FIG. 5A in one embodiment.

As shown in FIG. 6A, such a software toolkit is programmed in a training phase 80 with instructions of methods to collect Early Wafer/device data Measurements and chip metrics data at 82; Filter missing data outliers at 84; steps for Parsing sort criterion including performing generic data manipulation to define performance sorting bins which may be customized to data/project, and labeling the dataset at 85; Define SVM kernel parameters at 86; Define SVM model parameters at 87; and then perform the SVM model extracting (perform SVM classification and create SVM-based model for performance sort) at 88. At 89, this SVM model may then be stored in a re-usable format, e.g., in a memory storage device. The software provides an interactive programmable interface for users. Either via user initiated commands entered via the interface, automated steps are programmed and run in the tool 40 for selecting and storing the descriptor variables and performance related variables; generate performance classes based on the criteria determined by the user; execute a classification algorithm, such as SVM; perform new queries using new descriptor variables and the recently built and stored SVM model; and manage model building options.

In one aspect, the machine toolkit running on platform 40 runs further instructions implementing methods to build regression models for any variable used in the sorting criterion, and performing regression based modeling and subsequent sorting.

At any time during the foregoing processes, the platform 40 provides the ability to execute a prediction experiment for various performance criteria to find the best set of criteria. The platform 40 provides the ability to execute a prediction experiment for perturbed descriptor variables to find the sensitivity of the model accuracy; and the ability to execute a prediction experiment for perturbed descriptor variables to find the sensitivity of performance criteria to the particular descriptor variable. The methodology can give simple first-order sensitivities for manufacturing line adjustments.

As further shown in FIG. 6B, such a software toolkit is programmed in a predicting phase 90 with instructions of methods to collect to collect Early Wafer/device data Measurements and chip metrics data at 92; filter missing data Outliers at 94; then at 96, Load the stored built SVM Model from File/Memory and at 98, perform the classification of a device based on early measurements and, if pass continue manufacturing (else scrap). In one embodiment, the method includes implementing using the classifier model 45 an SVM-based sorting prediction on the new data (of a new wafer).

Figure 8:
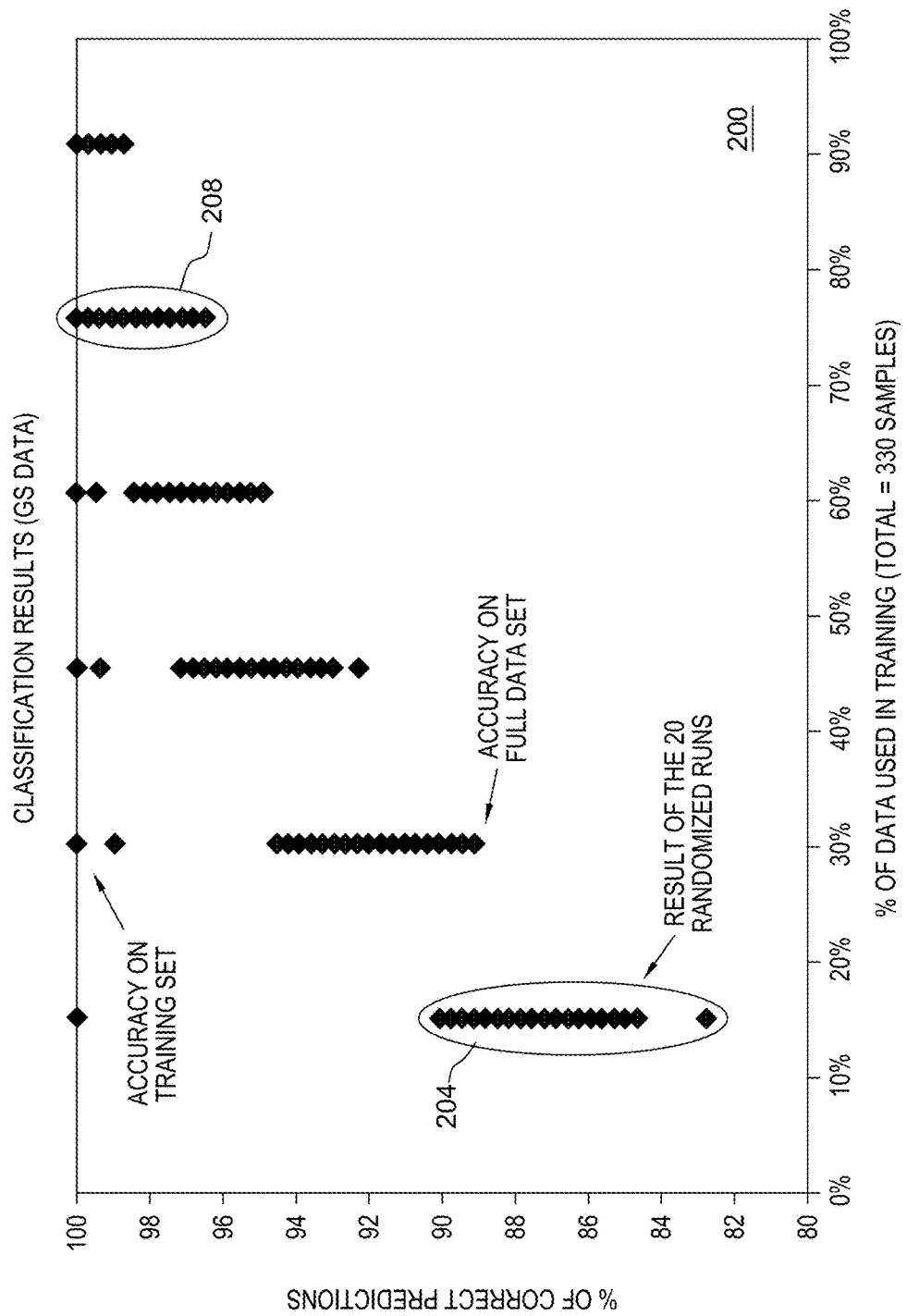
FIG. 8 shows an example plot 200 example classification results using the embodiment described herein with respect to FIGS. 5A and 5B.

FIG. 8 shows an example plot 200 example classification results using the embodiment described herein with respect to FIGS. 5A and 5B. In FIG. 8, there is plotted on the x-axis the % of data used in training vs. the % of correct predictions shown as values across the y-axis. For an example number of samples, the percent accuracy (percent of correct predictions) is shown. As can be seen from FIG. 8, given an example total of 330 training examples, using only 20% of the training examples yields example results 204. However, as the number of samples increases, the resulting prediction accuracy increases. For example, using 80% of the training examples yields example results 208 that are highly accurate, i.e., using 250 training points results in better than 95% accuracy. It is noted that the prediction results accuracy (i.e., percent of accurate predictions) of the full training data set is greater than the results accuracy (i.e., percent of accurate predictions) using less than the full amount of training data.

Figure 9:
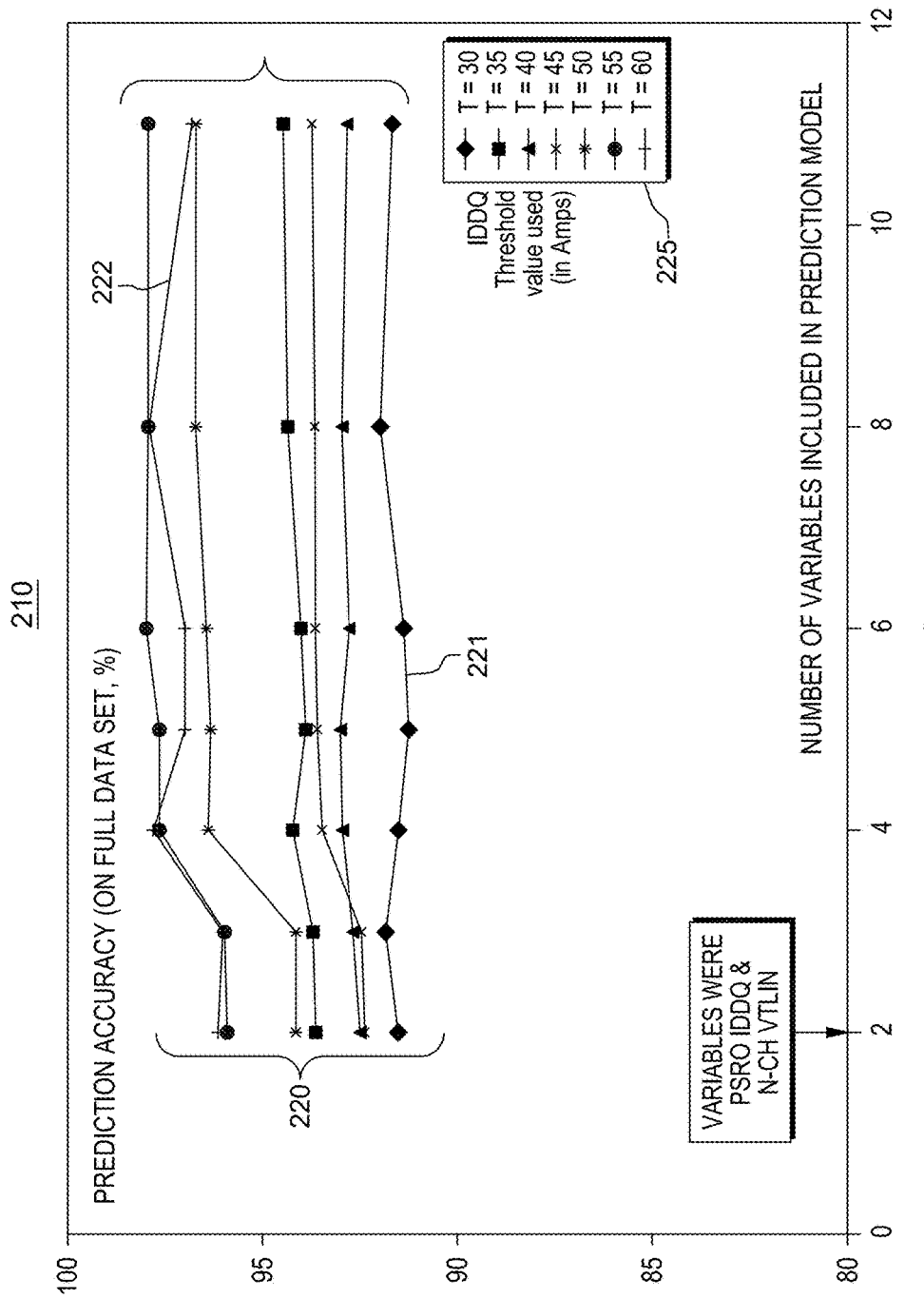
FIG. 9 shows an illustration 210 of example classification results obtained using the system of FIGS. 5A and 5B.

Referring to FIG. 9, there is shown an illustration 210 of example classification results obtained using the system of FIGS. 5A and 5B. In FIG. 9, there is plotted on the x-axis the number of variables used in the prediction model vs. the percent % of correct predictions (prediction accuracy using an example full data set) shown as values across the y-axis. For example, sample variables and variable types, the percent accuracy is shown. In the plots 220 of FIG. 9, example variables of the sample include: PSRO, IDDQ, N-CH VTLIN. FIG. 8 further illustrates a key 215 showing IDDQ threshold current amounts used (in Amperes) for the IDDQ criterion (leakage current performance criterions of a circuit) in the training data samples. The plots 220 illustrate how the prediction accuracy changes as a function of the number of variables used in the prediction with respect to a variable, e.g., the IDDQ variable, and particularly, the IDDQ threshold value. FIG. 8 illustrates the programmed method configuring the computer system to predict whether the off-state current of the resulting produced chip will be above a certain threshold value in order to classify chips as belonging in high or low leakage power categories. For example, as shown in FIG. 8, when the threshold of the IDDQ current variable is lowest, the probability of the IC chip exhibiting IDDQ current being over the threshold is high, and the prediction accuracy is lowest as indicated by the plot 221. However, for example, when the threshold of the IDDQ current variable is highest, the probability of being over the threshold is low, and the prediction accuracy is greatest as indicated by the plot 222. Making predictions for mid-range IDDQ threshold values may be more difficult than for the extreme values.

FIG. 9 further indicates the impact of the number of predictor variables on the quality of the prediction. As shown, it is possible to get good predictions with as few as 2 of the variables when properly chosen. That is, the two (2) samples PSRO IDDQ and N-CH VTLIN. PSRO IDDQ is the off-state current discharge of a PSRO (Performance Sensitive Ring Oscillator) and N-CH VTLIN is the threshold voltage of nch device using Linear region threshold detection method.

In a further embodiment, the programmed method configures the computer system to predict the overall chip power (at −10 degrees centigrade and +40 degrees centigrade) and particularly the accuracy in predicting IDDQ for a range of thresholds. As shown in FIG. 10, there is shown example data results 300 of implementing the method used in prediction accuracy of chip accuracy power represented as the % of chips passing 301 on the basis of different programmed IDDQ thresholds 305 for different example training data set sizes 310, (as shown 50% samples, 70% and 90% samples of the full training data set) at −10 degrees centigrade. The data illustrates: 1) that Higher classification, e.g., IDDQ threshold, values predicted better 315; and 2) there is a weak dependence on the training data set size as indicated by the trend of values 320.

FIG. 11 illustrates an exemplary hardware configuration of a computing system infrastructure 400 running software toolkit 40 in which the methods depicted in FIGS. 6A and 6B are programmed to run. In one aspect, computing system 20 and 21 receives or accesses the data from an input database, and is programmed with method instructions to perform the predictions using the pre-defined performance criterions to specify the categories to which the end-product is associated at the end of the manufacturing process. The hardware configuration preferably has at least one processor or central processing unit (CPU) 411. The CPUs 411 are interconnected via a system bus 412 to a random access memory (RAM) 414, read-only memory (ROM) 416, input/output (I/O) adapter 418 (for connecting peripheral devices such as disk units 421 and tape drives 440 to the bus 412), user interface adapter 422 (for connecting a keyboard 424, mouse 426, speaker 428, disk drive device 432, and/or other user interface device to the bus 412), a communication adapter 434 for connecting the system 400 to a data processing network, the Internet, an Intranet, a local area network (LAN), etc., and a display adapter 436 for connecting the bus 412 to a display device 438 and/or printer 439 (e.g., a digital printer of the like).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more tangible computer readable medium(s) having computer readable program code embodied thereon.

Any combination of one or more computer readable medium(s) may be utilized. The tangible computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with a system, apparatus, or device running an instruction.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with a system, apparatus, or device running an instruction.

Program code embodied on a computer readable medium may be transmitted using any appropriate medium, including but not limited to wireless, wireline, optical fiber cable, RF, etc., or any suitable combination of the foregoing. The computer readable medium excludes only a propagating signal.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may run entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which run via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which run on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more operable instructions for implementing the specified logical function(s). It should also be noted that, in some alternative implementations, the functions noted in the block may occur out of the order noted in the figures. For example, two blocks shown in succession may, in fact, be run substantially concurrently, or the blocks may sometimes be run in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The embodiments described above are illustrative examples and it should not be construed that the present invention is limited to these particular embodiments. Thus, various changes and modifications may be effected by one skilled in the art without departing from the spirit or scope of the invention as defined in the appended claims.

What is claimed is:

1. A computer-implemented method of manufacturing integrated circuits ICs, said method comprising:
   conducting, using a programmed processor of a computing system, in-line parametric measurements of performance-predictive parameters after a deposition of a first metallization level of an IC chip being manufactured, said performance-predictive parameters data including a quiescent current (IDDQ) leakage power and a performance scaling ring oscillator (PSRO) delay of a PSRO test structure;
   inputting, using said programmed processor, said IDDQ leakage power and PSRO delay performance-predictive parameters measurements data into a stored performance classifying model;
   running, by said programmed processor, said stored performance classifying model for determining a final frequency and power performance of said IC chip being manufactured based on said input IDDQ leakage power and PSRO delay performance-predictive parameters measurements, said performance classifying model built using an adaptive learning algorithm and a training data set, the training data set comprising: obtained first metallization level performance-predictive parameter measurements data obtained from each of plural prior-tested IC chip samples during their manufacture and final performance metrics data associated with each said plural prior-tested IC sample after its manufacture, and said model using a complex power sorting criterion for IC performance classification, said complex power sorting criterion defining a non-linear power sort threshold as a combined function of both the combined quiescent current (IDDQ) leakage power and the performance scaling ring oscillator (PSRO) delay in-line parametric measurements, the threshold defining a non-linear region for determining said final frequency and power product performance for said IC chip being manufactured; and
   in response to said determining, modifying a manufacturing step to optimize a manufacturing process to achieve a defined product performance specification for the IC chip being manufactured.

2. The method of claim 1, wherein said ICs comprises: a microprocessor or an Application Specific IC (ASIC) chip, said sorting criterion specifying a category to which the microprocessor or ASIC product is associated at the end of the manufacturing process.

3. The method of claim 1, wherein said specifying one or more sorting criterion comprises: selecting a performance criterion to maximize IC chip yield predicted by the built model and minimize false predictions of good parts.

4. The method of claim 1, wherein prior to building a model, said method including:
   generating one or more 2-D plots of a first performance predictive vs. another variable of the obtained early manufacturing data from which classifications of this data may be determined; and
   using said plot for said specifying a sorting criterion.

5. The method of claim 1, wherein said first performance predictive parameter comprises one of:
   a period of a performance scaling ring oscillator (PSRO) of said IC, a quiescent current (IDDQ) value of said IC, a beta ratio between an nFET transistor and pFET transistor structure of said IC, a threshold voltage of a transistor of said IC.

6. The method of claim 1, wherein said specifying said sorting criterion comprises:
   defining one or more of: a threshold or said combined function of said performance-predictive parameters to define one or more categories for performance sorting.

7. The method of claim 1, wherein a result of said subsequently predicting, using said built model, a performance based classification comprises one of:
   planning, modifying or optimizing a design or manufacturing step; and
   adjusting the performance criterion to accommodate an objective.

8. The method of claim 1, wherein said built model is based upon a Support Vector Machine algorithm, said built model performing SVM-based sorting prediction on the new early performance-predictive parameter data.

9. A computer-implemented system for manufacturing integrated circuits ICs comprising:
   a memory storage device;
   a processor unit coupled to said memory storage device and configured to:
   conduct in-line parametric measurements of performance-predictive parameters after a deposition of a first metallization level of an IC chip being manufactured, said performance-predictive parameters data including a quiescent current (IDDQ) leakage power and a performance scaling ring oscillator (PSRO) delay of a PSRO test structure;
   input said IDDQ leakage power and PSRO delay performance-predictive parameters measurements data into a stored performance classifying model;
   run said stored performance classifying model for determining a final frequency and power performance of said IC chip being manufactured based on said input IDDQ leakage power and PSRO delay performance-predictive parameters measurements, said performance classifying model built using an adaptive learning algorithm and a training data set, the training data set comprising: obtained first metallization level performance-predictive parameter measurements data obtained from each of plural prior-tested IC chip samples during their manufacture and final performance metrics data associated with each said plural prior-tested IC sample after its manufacture, and said model using a complex power sorting criterion for IC performance classification, said complex power sorting criterion defining a non-linear power sort threshold as a combined function of both the quiescent current (IDDQ) leakage power and the performance scaling ring oscillator (PSRO) delay in-line parametric measurements, the threshold defining a non-linear region for determining said final frequency and power product performance for said IC chip being manufactured; and in response to said determining, modify a manufacturing step to optimize a manufacturing process to achieve a defined product performance specification for the IC chip being manufactured.

10. The system of claim 9, wherein said ICs comprises: a microprocessor or an Application Specific IC (ASIC) chip, said sorting criterion specifying a category to which the microprocessor or ASIC product is associated at the end of the manufacturing process.

11. The system of claim 9, wherein to specify one or more sorting criterion, said processor unit is configured to: select a performance criterion to maximize IC chip yield predicted by the built model and minimize false predictions of good parts.

12. The system of claim 9, wherein prior to building a model, said processor unit is configure to:

generate one or more 2-D plots of a first performance predictive parameter vs. another variable of the obtained early manufacturing data from which classifications of this data may be determined; and use said plot for said specifying a sorting criterion.

13. The system of claim 9, wherein said first performance predictive parameter comprises one of:

a period of a performance scaling ring oscillator (PSRO) of said IC, a quiescent current (IDDQ) value of said IC, a beta ratio between an nFET transistor and pFET transistor structure of said IC, a threshold voltage of a transistor of said IC.

14. The system of claim 9, wherein to specify said sorting criterion, said processor unit is configure to:

define one or more of: a threshold or said combined function of said performance-predicting parameters to define one or more categories for performance sorting.

15. The system of claim 9, wherein a result of said subsequently predicting, using said built model, a performance classification comprises one of:

planning, modifying or optimizing a design or manufacturing step; and adjusting the performance criterion to accommodate an objective.

16. The system of claim 9, wherein said processor unit implements a Support Vector Machine algorithm to build said model, said processor unit performing SVM-based sorting prediction on the new early performance-predictive parameter data.

17. A computer program product comprising a non-transitory computer useable medium, said medium readable by a processing circuit and storing instructions run by a processing circuit for performing a method of manufacturing integrated circuits ICs, the method comprising:

conducting in-line parametric measurements of performance-predictive parameters after a deposition of a first metallization level of an IC chip being manufactured, said performance-predictive parameters data including a quiescent current (IDDQ) leakage power and a performance scaling ring oscillator (PSRO) delay of a PSRO test structure;

inputting said IDDQ leakage power and PSRO delay performance-predictive parameters measurements data into a stored performance classifying model;

running said stored performance classifying model for determining a final frequency and power performance of said IC chip being manufactured based on said input IDDQ leakage power and PSRO delay performance-predictive parameters measurements, said performance classifying model built using an adaptive learning algorithm and a training data set, the training data set comprising: obtained first metallization level performance-predictive parameter measurements data obtained from each of plural prior-tested IC chip samples during their manufacture and final performance metrics data associated with each said plural prior-tested IC sample after its manufacture, and said model using a complex power sorting criterion for IC performance classification, said complex power sorting criterion defining a non-linear power sort threshold as a function capturing a dependence between both the quiescent current (IDDQ) leakage power and the performance scaling ring oscillator (PSRO) delay in-line parametric measurements, the threshold defining a non-linear region for determining said final frequency and power product performance for said IC chip being manufactured; and in response to said determining, modifying a manufacturing step to optimize a manufacturing process to achieve a defined product performance specification for the IC chip being manufactured.

18. The computer program product of claim 17, wherein prior to building a model, said method including:

generating one or more 2-D plots of a first performance predictive parameter vs. another variable of the obtained early manufacturing data from which classifications of this data may be determined; and using said plot for said specifying a sorting criterion, wherein the obtained manufacturing level data comprises: in-line parametric measurements at the first level of metallization of an IC chip's manufacture.

* * * * *